310-335 SR
9/25/84 XR 4,473,769

United States Patent [19]

Nguyen

[11] Patent Number: 4,473,769

[45] Date of Patent: Sep. 25, 1984

[54] TRANSDUCER OF THE HALF-WAVE TYPE WITH A PIEZOELECTRIC POLYMER ACTIVE ELEMENT

[75] Inventor: Hoang G. Nguyen, Lisses, France

[73] Assignee: Thomson-CSF, Paris, France

[21] Appl. No.: 517,686

[22] Filed: Jul. 27, 1983

[30] Foreign Application Priority Data

Jul. 30, 1982 [FR] France ............................... 82 13357

[51] Int. Cl.³ ............................................. H01L 41/08

[52] U.S. Cl. .................................... 310/334; 310/335; 310/800; 310/366

[58] Field of Search ............... 310/322, 324, 334, 336, 310/337, 800, 366

[56] References Cited

U.S. PATENT DOCUMENTS

| | | | |
|---|---|---|---|
| 3,912,830 | 10/1975 | Murayama et al. | 310/800 X |
| 4,117,074 | 9/1978 | Tiersten et al. . | |
| 4,296,349 | 10/1981 | Nakanishi et al. | 310/800 |
| 4,383,194 | 5/1983 | Ohigashi et al. | 310/800 |

FOREIGN PATENT DOCUMENTS

| | | |
|---|---|---|
| 0015886 | 9/1980 | European Pat. Off. . |
| 2503517 | 10/1982 | France . |

OTHER PUBLICATIONS

Monolithic Silicon-$PVF_2$, Piezoelectric Arrays for Ultrasonic Imaging, by R. G. Swartz et al., presented at 8th International Symposium on Acoustic Imaging, Key Biscayne, Fla., May 1978.

*Primary Examiner*—Mark O. Budd
*Attorney, Agent, or Firm*—Oblon, Fisher, Spivak, McClelland & Maier

[57] ABSTRACT

The invention relates to electromechanical transducers of the half-wave type in which the active element is a foil of piezoelectric polymer surrounded by electrodes. The invention provides a transducer in which the vibrating structure comprises, integral with the active piezoelectric polymer foil, at least one passive foil serving as a support for the electrodes.

8 Claims, 7 Drawing Figures

TRANSDUCER OF THE HALF-WAVE TYPE WITH A PIEZOELECTRIC POLYMER ACTIVE ELEMENT

BACKGROUND OF THE INVENTION

1. Field of the Invention

The present invention relates to transducers of the half-wave type using as active element a piezoelectric polymer foil such as vinylidene polyfluoride.

2. Description of the Prior Art

These transducers have interesting applications in the field of medical diagnosis by examination of tomoechographic images. Piezoelectric polymer materials offer the advantage of having an acoustic impedance of the same order of size as that of the propagation media. These materials are also easy to use, for they may be molded, thermoformed and their flexibility may be turned to account. On the other hand, these materials have relatively low piezoelectric properties compared for example with those of piezoelectric ceramics and they pose technological problems particularly in so far as the mediocre adherence of the metal layers intended for forming the electrodes of a transducer is concerned. When aluminium, nickel, chromium or gold is deposited by evaporation in a vacuum on a polyvinylidene fluoride foil, difficulties are met with for providing certain electrode configurations somewhat extensive or corresponding to a complicated pattern. When a very high acoustic impedance reflecting medium is available contiguous to the rear face of a piezoelectric polymer foil, the electrode deposits may be effected on this medium provided that it is insulating and that it allows a better adherence. However, the transducers formed according to this principle operate at a quarter wave and it has been discovered that the conversion losses, the depth resolution and the pass-band are not as good as with a configuration operating at half-wave or full-wave. Half-wave operation in fact allows a closer approach to a perfect reflection of the waves towards the external face of the transducer, for the medium loading the rear face of the transducer has an acoustic impedance typically equal to that of air, i.e. practically zero. On the other hand, such a non dissipating medium does not form an appropriate support for depositing electrodes thereon and another means must be used to solve the problem posed, i.e. the lack of adherence of metal deposits to piezoelectric polymers.

Configurations of the half-wave or full-wave type perform better in so far as the pass-band and sensitivity are concerned. They are usually formed by a piezoelectric polymer foil whose external face is coupled to the biological medium via an impedance matching quarter-wave layer and whose internal face is directly in relation with the air contained inside a case or with a similar low impedance medium, a polymer foam for example. The distance between external and internal faces is wholly occupied by the active material whose thickness corresponds very often to a half wavelength of the central operating frequency.

While maintaining the principle of half-wave or full-wave excitation, the invention suggests forming the vibrating structure by bringing together several layers one of which, the active one, provides the transducer effect, the others simply playing the role of electrode supports. These electrode carrying layers are integral with the active layer so that a stratified vibrating structure is obtained which remains half-wave as a whole although partially active. Since the layers fixed by bonding to the active layer may have their electrodes in contact with the active layer, the problem of adherence is solved by maintaining a small spacing between the electrodes and perfect reflection of the waves at the rear face of the composite structure, which is in direct relation with a very low acoustic impedance reflecting medium.

SUMMARY OF THE INVENTION

The invention provides a transducer of the half-wave type with a piezoelectric polymer active element comprising at least two electrodes surrounding a foil of piezoelectric polymer material mounted on a support; said transducer having an external radiating face intended to be coupled to a medium having an acoustic impedance of the same order as that of said piezoelectric polymer material and an internal face in direct relation inside said support with a reflecting medium having a very substantially lower acoustic impedance, wherein at least the electrode situated on the same side as said reflecting medium is provided on a substrate in the form of a foil integral with said foil of piezoelectric polymer material; the free face of said substrate forming said internal face.

BRIEF DESCRIPTION OF THE DRAWINGS

The invention will be better understood from the following description and the accompanying figures in which.

DESCRIPTION OF THE PREFERRED EMBODIMENTS

Figure 1:
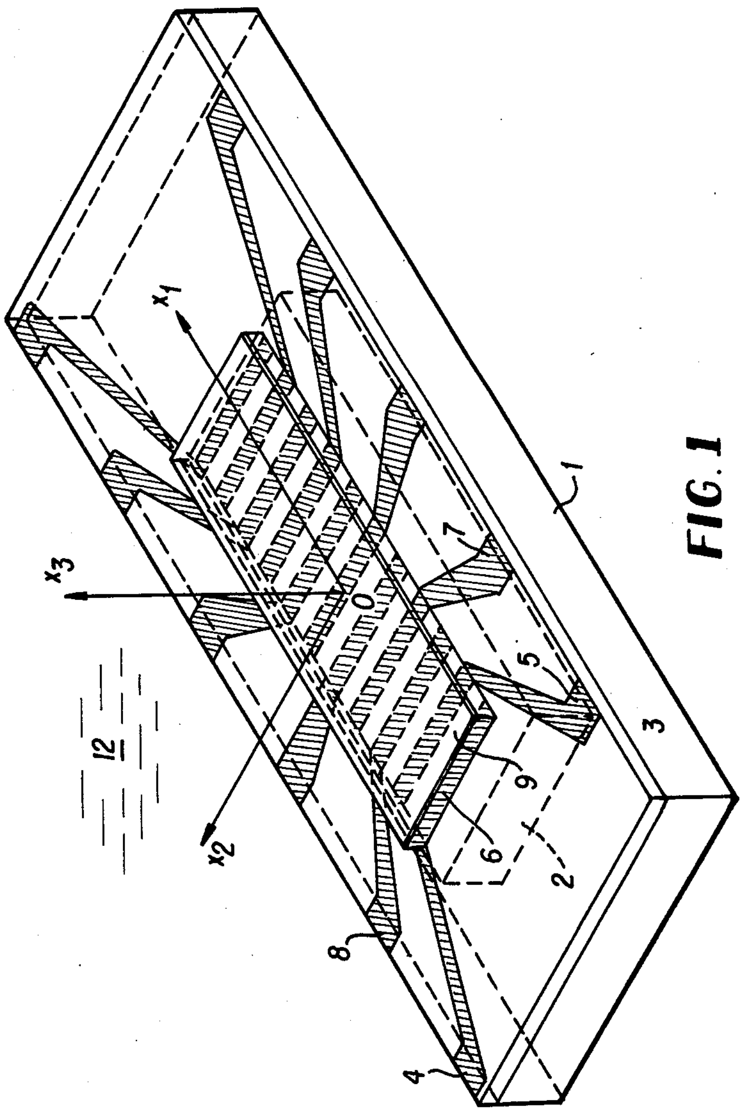
FIG. 1 is an isometric view of a network transducer according to the invention.

In the following description, two types of transducer configurations will be dealt with successively. The simplest comprises a single pair of electrodes defining a transducer with a single emissive surface; the other is provided with two sets of electrodes for defining several elementary radiating zones arranged in a network. These electromechanical transducers can be reversibly used, either for emitting acoustic waves in a medium from an external radiating face coupled to this medium, or for converting incident acoustic radiation coming from the same medium into electric voltages. The propagation medium considered is in general a biological medium comparable to a volume of water and, if need be, this medium is coupled to the external face of the transducer by means of a water pocket. Of course, the invention is not limited to the case of coupling with a biological medium, for it applies to any medium whose acoustic impedance is of the same order of size as that of the active or passive materials forming the vibrating structure.

The study in volume of the vibrating modes of an elementary resonator formed by a block of height H and width L made from a piezoelectrically active resilient material shows that, equipped with electrodes of width L spaced apart by H, this block may vibrate in the direction perpendicular to the electrodes but also in directions parallel thereto. When the ratio L/H is greater than three, the thickness mode tends to occur at a frequency at which the wavelength $\lambda$ in the material is equal to twice the height H, which defines half-wave operation. If the ratio L/H is less than unity, it has been discovered that the operating frequency may be less than the one calculated from the expression $H=\lambda/2$, nevertheless we still have half-wave operation which is characterized by the free vibration of one of the faces carrying the electrodes.

Full wave operation is similar to half-wave operation, for one of the faces carrying the electrodes is still free to vibrate and to reflect the waves towards the other face. In practice, with transducers formed from a foil coated with electrodes on both its faces, the height H to be considered is of course the thickness of the foil, whereas the width L is quite simply deduced from the width of the electrodes. Thus, the volume surrounded by two electrodes represents, within a foil, the elementary volume mentioned above and such volumes may be defined by electrodes disposed in a pattern so as to form an aligned array of radiating sources. In the case of a piezoelectric polymer transducer structure, decoupling between elementary vibrating volumes does not require the presence of special cut-outs such as notches formed in the piezoelectric material. This is due to the fact that the piezoelectric polymer materials polarized along the direction $x_3$ perpendicular to the electrodes carried by the two faces of the foil have a piezoelectric coefficient $d_{33}$ substantially greater than the piezoelectric coefficients $d_{31}$ and $d_{32}$ which correspond to vibrations along axes $x_1$ and $x_2$.

Before beginning the detailed description of the figures, it is useful to recall the acoustic impedance values of some materials used in transducers and media which surround these materials.

| Materials | Acoustic impedance |
|---|---|
| Water | $1.5 \times 10^6$ kg/m$^2$s |
| Polystyrene | $2.2 \times 10^6$ kg/m$^2$s |
| Polyvinylidene fluoride ($PVF_2$) | $3.7 \times 10^6$ kg/m$^2$s |
| Air | $4.28 \times 10^2$ kg/m$^2$s |
| Polyethylene terephthelate (PETP) | $3.2 \times 10^6$ kg/m$^2$s |

It can be seen that the acoustic impedance of air is negligible with respect to that of the other materials appearing in this table. The polystyrene used as quarter-wave transformer is a material allowing the impedance of the polyvinylidene fluoride to be matched to that of water. Polyethylene terephthalate has an acoustic impedance close to that of polyvinylidene fluoride and it forms an appropriate substrate for metal deposits having a good adherence.

In FIG. 1 is shown an isometric view of an electromechanical transducer formed in accordance with the invention. This transducer comprises a base 1 having a central recess 2. A thin foil of polyethylene terephthalate is bonded by its periphery to base 1. Electrode deposits 4,5,7,8 are made on the upper face of foil 3. These deposits form in the middle of foil 3 a grating of parallel conducting strips which overhang the recess 2. These conducting strips are covered by a piezoelectric polymer foil 6, made for example from polyvinylidene fluoride. Foil 6 is bonded to foil 3 and carries on its upper face a counter-electrode 9 which cooperates with each of the conducting strips in the grating so as to define elementary volumes of piezoelectric polymer which represent elementary radiating sources.

As shown in FIG. 1, the electrode deposits 4,5,7 and 8 are extended across foil 3 to the outside of the rectangular zone covered by the foil 6, so as to allow connections spaced further apart for the application of excitation voltages between the common counter-electrode 9 and the grating electrodes which extend along the interface between foil 6 and foil 3. The system of the axes $0,x_1,x_2,x_3$ is situated in the space which overhangs the radiating face of the transducer here formed by the counter-electrode 9. This space is in general occupied by a propagation medium 12 having the acoustic impedance of water.

Figure 2:
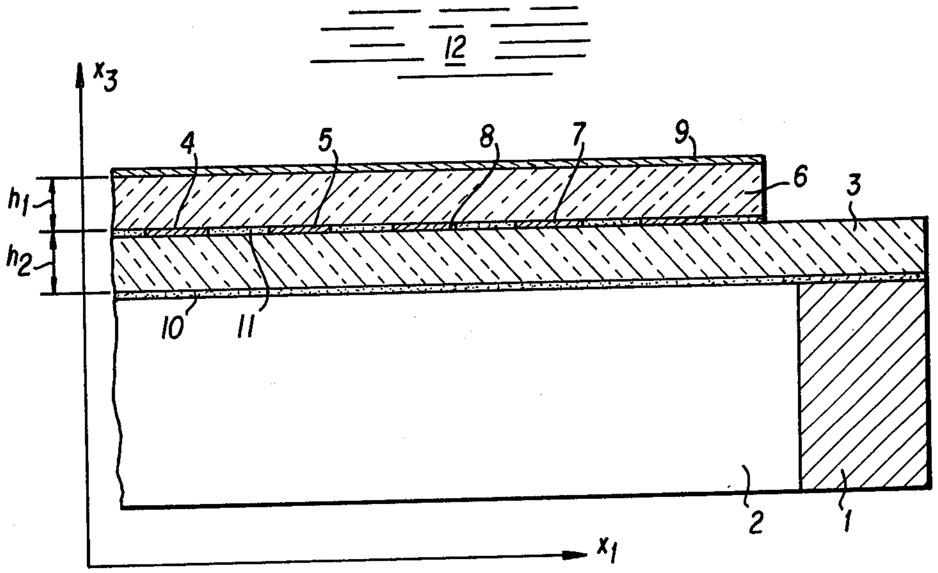
FIG. 2 is a partial section of the transducer shown in FIG. 1.

FIG. 2 is a partial sectional view of the electromechanical transducer of FIG. 1. It can be seen that foil 3 is made from a passive polymer material, is fixed to base 1 by a peripheral bonding seal 10 and carries the conducting strips 4,5,8 and 7 which serve as rear electrodes for the piezoelectric polymer foil 6. A bond seal 11 joins these two foils 3 and 6 together in the part which overhangs recess 2. Thus, a mixed active and passive vibrating structure having a total thickness $h_1+h_2$ is inserted between the propagation medium 12 and the medium which fills recess 2. The half-wave or full-wave operation of the arrangement of FIG. 2 has been tested while using a polyvinylidene fluoride foil 6 of a thickness $h_1=220$ $\mu$m. Medium 12 was formed by water and the medium filling recess 2 was air. A polyethylene terephtalate foil 3 whose thickness $h_2$ varied between 0 and 200 $\mu$m allowed the curves of FIG. 3 to be plotted. Electrodes 4,5,7 and 8 had a width greater than thickness $h_1$ of foil 6, so that the central operating frequency corresponds fairly exactly with the half-wave or full-wave operation.

Figure 3:
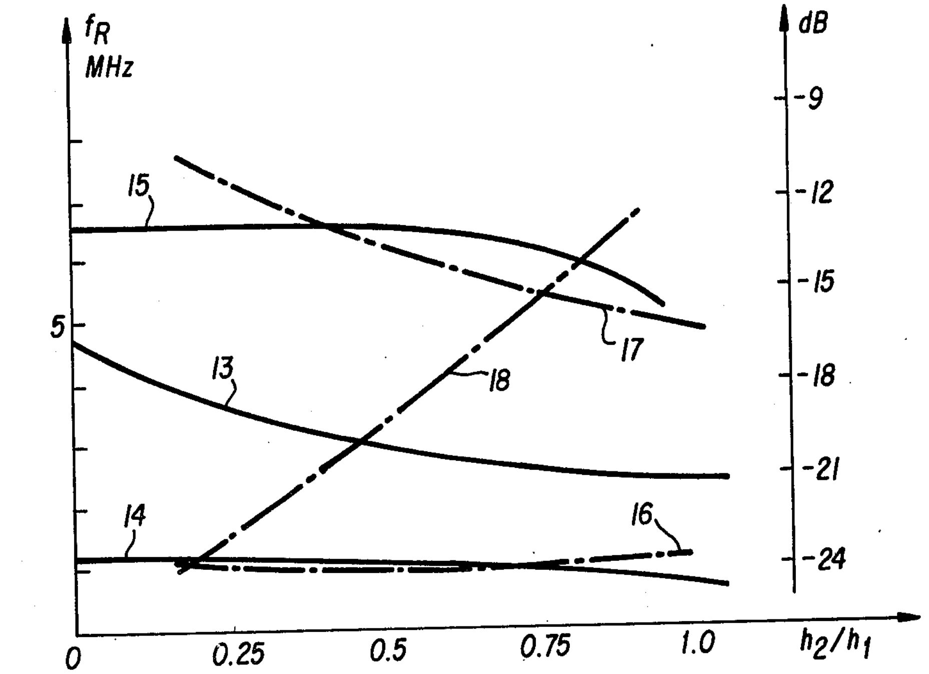
FIG. 3 is an explanatory figure.

In FIG. 3, the parameter $h_2/h_1$ is shown as abscissa and the central operating frequency $f_R$ as ordinates. There is also shown as ordinates the measurement of conversion losses of the transducer to a decibel scale. Curves 13, 14 and 15 relate to the half-wave operating mode whereas curves 16,17 and 18 in broken lines relate to the full-wave operating mode.

Curve 13 shows that the central operating frequency of the transducer is reduced when the thickness of foil 3, which serves as a support for the electrodes, is increased. This effect is quite foreseeable, since the half-wave operation of the vibrating structure relates the operating frequency to the choice of thicknesses $h_1$ and $h_2$ taking into account the propagation velocities in the media 3 and 6 which form this structure. The vibrations originating in the active foil 6 undergo little reflection when they penetrate into foil 3 for the impedances of the two juxtaposed media are advantageously chosen close to each other. On the other hand, the vibrations undergo practically perfect reflection at the lower face of foil 3 where they are reflected towards medium 12 so as to obtain maximum radiation. Curve 15 which represents the conversion losses shows that the addition of foil 3 allows low losses to be maintained not exceeding 15 dB for a thickness $h_2$ reaching 200 $\mu$m. Curve 14 is read from the frequency scale and gives as absolute value the transducer pass-band $\Delta F$. It can be seen that this pass-band varies little since it remains between 1.2 and 0.8 MHz. The presence of foil 3 allows then a good conversion efficiency and a good resolution to be obtained while providing a considerable advantage in the provision of metal deposits having good adherence. The broken line curves which relate to full-wave operation show generally less favorable characteristics. Curve 17 gives the operating frequency which is higher, since a full wave must be established between the endmost faces of the vibrating structure. Curve 18 gives the value of the conversion losses which are generally higher than in half-wave operation. However, when the thickness of foil 3 is of the same order as that of foil 6, it can be seen that the conversion loss is practically as low as with foil 6 alone in half-wave operation. Curve 16 which gives the pass-band shows that this may be as good, even better, than with the half-wave operation mode.

From what has been said, it can be seen that foil 3, although it is passive, perfectly solves the problem of the adherence of electrodes 4,5,7,8 while maintaining good operating qualities of the transducer not only in sensitivity but also in resolution.

Figure 4:
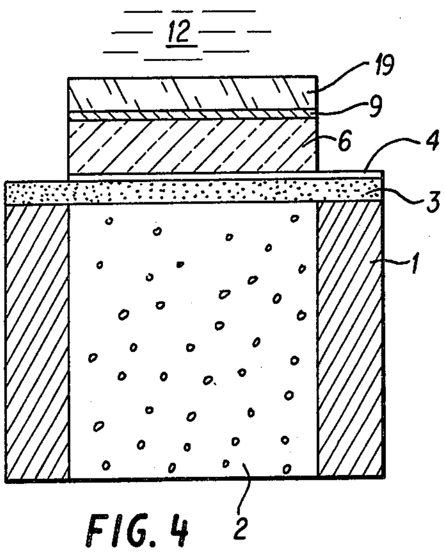
FIG. 4 is a first embodiment of the transducer of the invention.

In FIG. 4 can be seen another embodiment in which, over electrode 9, there is provided a quarter-wave layer 19 made from polystyrene which provides impedance matching between the propagation medium 12 and the piezoelectric polymer material 6. This impedance matching increases the relative pass-band to 5 MHz, which goes from 26% to 32% and layer 19 may serve as a support for the electrode deposit 9 before being bonded to the piezoelectric polymer foil 6.

Generally, a metal deposit adheres much better to organic material supports having a double oxygen carbon bond and much less well to piezoelectric polymer materials such as polyvinylidene fluoride $PVF_2$ or the PVF-TRFE copolymers.

In FIG. 4 it can be seen that recess 2 of base 1 may be completely or partially filled with a low density porous material having a fairly low acoustic impedance to ensure high reflectivity at the lower face of foil 3.

To sum up, it can be seen that the technique proposed consists in adding a non piezoelectric polymer layer whose acoustic impedance is close to that of the piezoelectric polymer and whose thickness varies between 0.04 and 0.5 wavelength. Bonding of the layers may be achieved by means of an epoxy resin by preferably placing the electrodes against the faces of the piezoelectric polymer foil.

Figure 5:
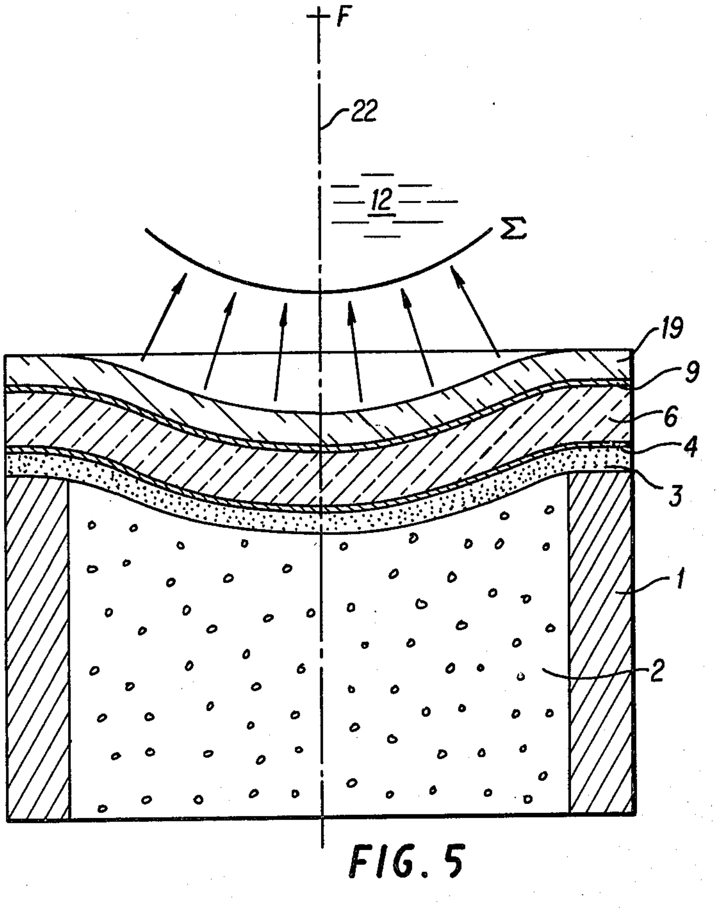
FIG. 5 is a second embodiment of the transducer of the invention.

In the preceding figures, a monoprobe transducer and a network transducer having flat radiating surfaces have been described. In FIG. 4 is shown a monoprobe transducer which differs from the transducer of FIG. 4 by the spherical skull-cap shape given to its radiating face. This shape may be obtained by pressing the assembly of foils 3,6,9 in a preform. Solidification of the bonding agent may take place during the preforming operation, so as to ensure that the deformations imposed by the preform are maintained. Separately preformed pieces may also be bonded together by thermoforming. When the monoprobe device of FIG. 5 has the symmetry of revolution about axis 22 and when F is the center of curvature of the radiating face, the wave Σ emitted may be focussed at point F.

Figure 6:
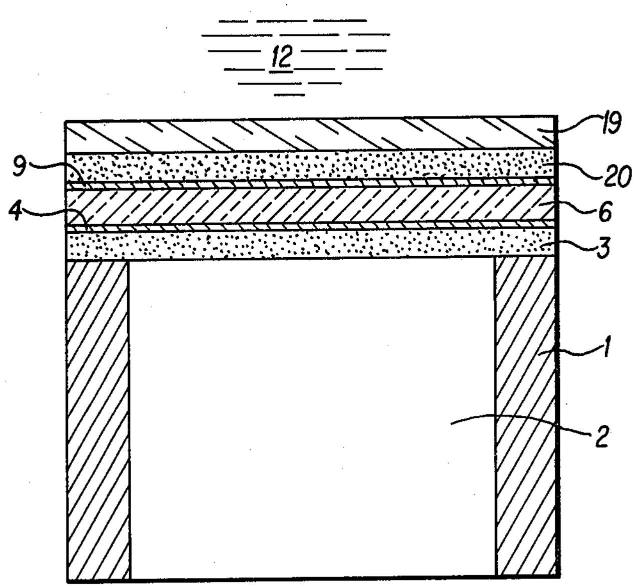
FIG. 6 is a third embodiment of the transducer of the invention.

In FIG. 6 can be seen another embodiment of the device of FIG. 4 which consists in providing on each side of the active foil 6 foils 3 and 20 made from passive materials having an acoustic impedance close to the acoustic impedance of the active material of foil 6. The vibrating structure obtained by bonding together foils 20,6 and 3 may operate with half-wave or full-wave between quarter-wave matching layer 19 and a low impedance medium such as air filling the recess 2 of base 1. The acoustic impedance of the quarter-wave matching layer is chosen close to the geometrical mean of the acoustic impedances of the propagation medium and of active layer 6.

Figure 7:
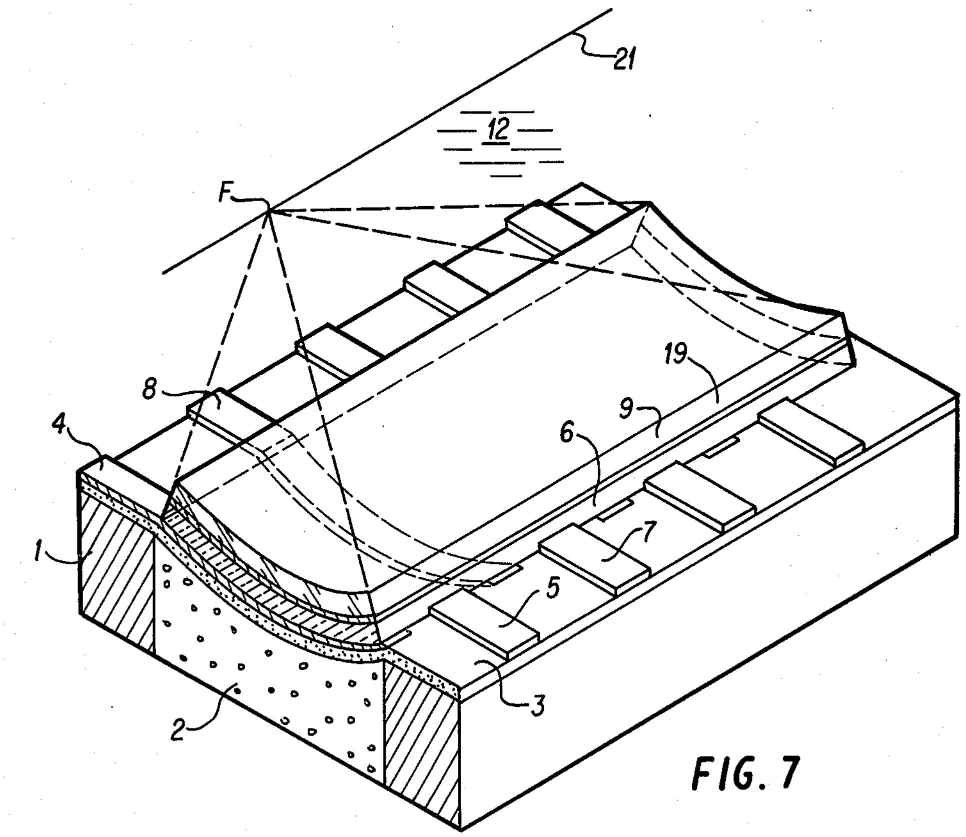
FIG. 7 is a partial isometric view of a fourth embodiment of the transducer of the invention.

In FIG. 7 is shown another transducer variant in accordance with the invention. This variant uses a radiating face cylindrical in shape and having for axis the line 21. Thus, the radiation is focussed in a plane perpendicular to line 21. So that it may be focussed in a plane containing line 21, the transducer comprises an array of sources. Each source is a vibrating structure part defined by an active portion of foil 6 between the counter-electrode 9 and an electrode 4,5,7 or 8. By applying to electrodes 4,5,7,8 suitably delayed electric voltages, the acoustic radiation may be caused to converge at a point F of line 21.

By way of non limiting embodiment, the array arrangements of FIGS. 1 and 7 may be formed on a polyethylene terephtalate foil measuring 12.5 cm in length and 3.5 cm in width. The central grating of parallel conducting strips may occupy a rectangular area 4 cm in length and 1.4 cm in width. The conducting strips of the grating may have a width of 125 μm and a pitch of 250 μm. Such a grating arrangement may operate at 3 MHz. In this case, the electrodes are photoetched or deposited through a mask on the polyethylene terephtalate foil 3, after which a polyvinylidene fluoride foil 6 measuring 4 cm in length and 1.4 cm in width is added to the central part. After bonding of foil 6 with its metalization 9 to foil 3 and after bonding of a matching polystyrene strip 19 to electrode 9, the assembly is mounted on a frame shaped base 1 so that the whole active surface overhangs a central recess of base.

I claim:

1. A half-wave electro-acoustic transducer device, comprising:

(a) a rigid frame having a recess and a rim, and a covering layer of an organic material having an inner face and an outer face, said inner face being fixed to said rim for capping said recess;

(b) said device further comprising a foil of piezoelectric fluorinated polymer material having a radiating face and a rear face bonded along said outer face for forming with said covering layer a bilayer half-wave transducer structure;

(c) said device still further comprising a first electrode deposit extending along said outer face and partially masked by said foil;

(d) said radiating face carrying a second electrode deposit facing said first electrode deposit;

(e) said inner face being acoustically coupled with a backing reflector medium having an acoustic impedance very substantially smaller than the acoustic impedance of said piezoelectric fluorinated polymer material; and (f) said organic material being selected for having an acoustic impedance value close to the acoustic impedance value of said piezoelectric fluorinated polymer material coupled with better adherence with said first electrode deposit.

2. The transducer of claim 1, which further comprises a set of electrodes and a counter-electrode surrounding said piezoelectric polymer foil.

3. The transducer of claim 1 or 2, wherein said radiating face is flat.

4. The transducer of claim 1 or 2, wherein said radiating face comprises at least one curved section.

5. The transducer of claim 1 or 2, which further comprises an impedance matching quarter-wave element.

6. The transducer of claim 5, wherein said quarter-wave element is a polystyrene foil.

7. The transducer of claim 5, wherein said organic material is polyethylene terephthalate.

8. The transducer of claim 1, wherein said organic material is such that it contains double oxygen carbon bond structures.

* * * * *